US012693350B2

(12) United States Patent
Beato et al.

(10) Patent No.: US 12,693,350 B2
(45) Date of Patent: Jul. 28, 2026

(54) SENSOR ASSEMBLY COMPRISING A MOUNTING SUPPORT FOR A DIAMOND

(71) Applicant: KWAN-TEK, Pioemeur (FR)

(72) Inventors: François Beato, Lorient (FR); Baptiste Roussel, Lorient (FR); Thomas Hingant, Rennes (FR)

(73) Assignee: KWAN-TEK, Ploemeur (FR)

( * ) Notice: Subject to any disclaimer, the term of this patent is extended or adjusted under 35 U.S.C. 154(b) by 189 days.

(21) Appl. No.: 18/834,593

(22) PCT Filed: Jan. 26, 2023

(86) PCT No.: PCT/EP2023/051931
§ 371 (c)(1),
(2) Date: Jul. 30, 2024

(87) PCT Pub. No.: WO2023/148081
PCT Pub. Date: Aug. 10, 2023

(65) Prior Publication Data
US 2025/0147127 A1 May 8, 2025

(30) Foreign Application Priority Data
Feb. 3, 2022 (EP) ..................................... 22305121

(51) Int. Cl.
G01R 33/032 (2006.01)
(52) U.S. Cl.
CPC .................................. G01R 33/032 (2013.01)
(58) Field of Classification Search
CPC .. G01R 33/032; G01R 33/0047; G01R 33/26; G01R 33/323; G01N 24/006
See application file for complete search history.

(56) References Cited

U.S. PATENT DOCUMENTS

| | | | | |
|---|---|---|---|---|
| 2017/0343621 A1* | 11/2017 | Hahn | ................. | G01R 33/1284 |
| 2022/0206086 A1* | 6/2022 | Nguyen | .............. | G01N 24/006 |
| 2023/0084726 A1* | 3/2023 | Walsworth | ........... | G01R 33/323 |
| | | | | 324/304 |

FOREIGN PATENT DOCUMENTS

| | | |
|---|---|---|
| CN | 105352489 A | 2/2016 |
| CN | 111504499 A | 8/2020 |

(Continued)

OTHER PUBLICATIONS

Sergei Masis et al: "Optically detected flip-flops between different spin ensembles in diamond", arxiv.org, Cornell University Library, 201 Olin Library Cornell University Ithaca, NY 14853, Mar. 16, 2021 (Mar. 16, 2021), XP081911213, figure 1.

(Continued)

*Primary Examiner* — Giovanni Astacio-Oquendo
(74) *Attorney, Agent, or Firm* — LEASON ELLIS LLP

(57) ABSTRACT

The invention relates to a sensor assembly (10) comprising a mounting support (20) and a nitrogen-vacancy diamond (12) connected to at least one optical fiber (22), said mounting support (20) comprising: —a support element (30) having a bottom surface (32) defining a reference plane (P2), and having, at a front end, a socket (36) designed to receive the nitrogen-vacancy diamond (12) in a predetermined angular position (a1) allowing predetermined alignment of its nitrogen-vacancy axis with regards to the reference plane (P2), said socket (36) comprising a recess (40) for housing said nitrogen-vacancy diamond (12) in the predetermined angular position (a1), and —a holder element (50) which is mounted on the support element (30), and which comprises a guiding surface (52) to guide and bend the optical fiber (22) from the nitrogen-vacancy diamond (12) to a rear portion of the holder element (50).

15 Claims, 6 Drawing Sheets

(56) References Cited

FOREIGN PATENT DOCUMENTS

DE    102018208055  A1    11/2019
EP         3851863  A1     7/2021

OTHER PUBLICATIONS

International Search Report and Written Opinion in PCT Application No. PCT/EP2023/051931, mailed Apr. 20, 2023 (10 pages).
Rondin, "Creation of a magnetometer with colored center NV of the diamond" (Réalisation d'un magnétomètre à centre coloré NV du diamant), HAL open science, May 21, 2013.
Hatano et al., "Simultaneous thermometry and magnetometry using a fiber-coupled quantum diamond sensor", Appl. Phys. Lett. 118, 034001 (2021); doi: 10.1063/5.0031502, Submitted Oct. 3, 2020.
Chatzidrosos et al., "Fiberized Diamond-Based Vector Magnetometers", Frontiers in Photonics, Aug. 2021, vol. 2, Article 732748, pp. 1-9.

* cited by examiner

SENSOR ASSEMBLY COMPRISING A MOUNTING SUPPORT FOR A DIAMOND

CROSS-REFERENCE TO RELATED APPLICATION

This application is a national stage filing under 35 U.S.C. § 371 of international application number PCT/EP2023/051931, filed Jan. 26, 2023, which claims priority to European patent application No. 22305121.0, filed Feb. 3, 2022. The contents of these applications are incorporated herein by reference in their entireties.

TECHNICAL FIELD

A sensor assembly comprising a nitrogen-vacancy diamond forming a source of fluorescence coupled to a fluorescence collector is described. A magnetometer comprising the sensor assembly is also described.

BACKGROUND

Magnetometers based on the probing of the energy level differences in Nitrogen Vacancy (NV) color centers in diamonds are a promising technology, for example for magnetic field stabilization. In such case, the NV magnetometer is used to measure the fluctuations of a supposedly constant, or slowly varying magnetic field, in order to compensate these fluctuations. In order to be able to measure efficiently fields with high intensities (>30 mT), the NV center has to be aligned with the field to measure. Using a fiber is important to access regions where space is constrained, like in the case of atomic physics experiments, where several lasers address the same atomic cloud (where the field needs to be controlled). Hence, a small and deported sensor is desirable It has been proposed to use an optical fiber to excite an NV diamond crystal and to collect the resulting fluorescence. Indeed, coupling diamonds with NV centers to fibers can make them good candidates for performing magnetometry in challenging environments. An NV-based magnetometer in which an optical fiber is used is described by Chatzidrosos, Georgios, et al. "Fiberized Diamond-Based Vector Magnetometers." Frontiers in Photonics, 2021.

In order to align the magnetic field with the NV axis in, the lack of references imposes to use adjustable angular mounts, such as tip-tilt platforms. While good alignment can be achieved with this, a mechanical alignment requires a calibration and complex mechanics that can be prone to drifts in time, for example if a spring-loaded mount loosens or is subjected to vibrations. Ideally, a bulk sensor is desirable.

An alternative is to use diamonds with one facet perpendicular to a (111) diagonal. This is for example used in the work of Hatano et al. (Appl. Phys. Lett. 118, 034001 (2021)). However, this leads to costly and hard to manufacture diamonds.

It is therefore desirable to provide a sensor assembly allowing to use standard diamond where the cut facets correspond to the {100} planes.

SUMMARY

The scope of protection is set out by the claims.
A first aspect concerns a sensor assembly comprising:
a nitrogen-vacancy diamond, an optical fiber which front end is connected to a top main surface of the nitrogen-vacancy diamond,
a micro-wave cable which front end is connected to the nitrogen-vacancy diamond,
a mounting support,
characterized in that the mounting support comprises a support element having a bottom surface defining a reference plane, and having, at a front end, a socket designed to receive the nitrogen-vacancy diamond in a predetermined angular position other than zero and 90 degrees allowing predetermined alignment of its nitrogen-vacancy axis with regards to the reference plane, said socket comprising a recess for housing said nitrogen-vacancy diamond in the predetermined angular position.

According to an embodiment, the recess comprises peripheral retaining surfaces for the diamond which form predetermined angles such that, when the nitrogen-vacancy diamond is received in the recess, a diagonal extending from a diamond top corner to a diamond bottom corner is within a longitudinal plane perpendicular to the reference plane.

According to an embodiment, the recess comprises an extruded platform which forms a bearing surface for a main surface of the nitrogen-vacancy diamond, said platform being elevated compared to a recess bottom portion.

According to an embodiment, the bearing surface is tilted, with regards to the reference plane, of an angle around 54.7 degrees or 125.3 degrees+/−5 degrees.

According to an embodiment, the mounting support comprises a holder element on the support element, and which comprises a guiding surface to guide and bend the optical fiber from the nitrogen-vacancy diamond to a rear portion of the holder element, said optical fiber having a front section received in the holder element.

According to an embodiment, the guiding surface is arranged on a front portion of the holder element, close to the socket, said guiding surface comprising a groove having an arc shaped profile within a longitudinal plane perpendicular to the reference plane.

According to an embodiment, the groove is designed such that a tangent to the arc shaped profile at a groove front end is perpendicular to a diamond main surface which receives a front end of the optical fiber.

According to an embodiment, the rear portion of the holder element comprises a channel part which extends from the front portion to a rear end of the holder element, and which is designed to hold at least a section of the optical fiber.

According to an embodiment, the recess is arranged in a socket sloped surface defining a slope angle corresponding to the predetermined angular position.

According to an embodiment, the holder element front portion comprises a holder element sloped surface which is complementary to the socket sloped surface and which comes in abutment against the socket sloped surface when the nitrogen-vacancy diamond is in position inside the recess.

According to an embodiment, the support element comprises an elongated portion forming a guiding rail for the holder element to allow the holder element to slide from a rear position away from the socket to a front position in abutment against the socket.

According to an embodiment, the sensor assembly comprises a top cover which is arranged above the socket to enclose the nitrogen-vacancy diamond and the optical fiber.

According to an embodiment, the socket is made of one piece with the support element.

According to an embodiment, the nitrogen-vacancy diamond is a monocrystalline face-centered cubic diamond, the cut facets of the nitrogen-vacancy diamond corresponding to the {100} planes such that a nitrogen-vacancy axis within the nitrogen-vacancy diamond is perpendicular to the reference plane when it is mounted in the socket.

Another aspect of the invention relates to a magnetometer comprising a sensor assembly according to any of the preceding embodiments.

BRIEF DESCRIPTION OF THE DRAWINGS

Example embodiments will be more fully understood from the detailed description provided herein and the accompanying drawings, which are given by way of illustration only.

It should be noted that these figures are intended to illustrate the general characteristics of methods, structure and/or materials utilized in the described exemplary embodiments. The drawings are not to scale and should not be interpreted as limiting the range of values or properties encompassed by the exemplary embodiments.

DETAILED DESCRIPTION

Various exemplary embodiments will now be described more fully with reference to the accompanying drawings.

However, specific structural and functional details disclosed herein are merely representative for purposes of describing example embodiments. The exemplary embodiments may be embodied in many alternate forms and should not be construed as limited to only the embodiments set forth herein. It should be understood that there is no intent to limit example embodiments to the particular forms disclosed.

Figure 1:
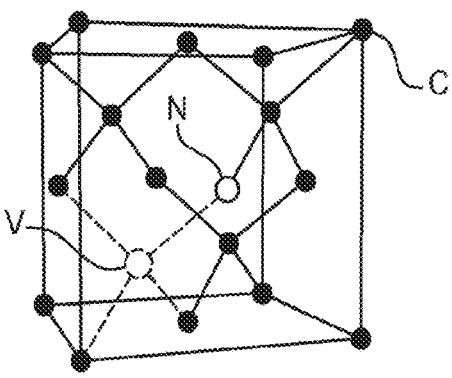
FIG. 1 is a schematic representation of a diamond crystal and its carbon atoms (C), and comprising a nitrogen atom (N) and a vacancy (V), the latter two forming an 'NV center'.

NV magnetometry is based on the use of a particular defect of the diamond crystal lattice in the solid state. The term NV (Nitrogen-Vacancy) center refers to the substitution of a carbon atom by a nitrogen atom, directly adjacent to a lattice vacancy (a missing carbon atom), as shown in FIG. 1. This defect presents energy levels and various interesting physical characteristics, which can be used in a magnetic field sensor. These measurements can also be used to determine temperatures, electric fields, strains and pressure. In particular, when a NV diamond crystal (containing millions of NV centers) is irradiated with green light (e.g. coming from a laser or a LED), it fluoresces red light with an intensity generally proportional to the irradiation.

Figure 2:
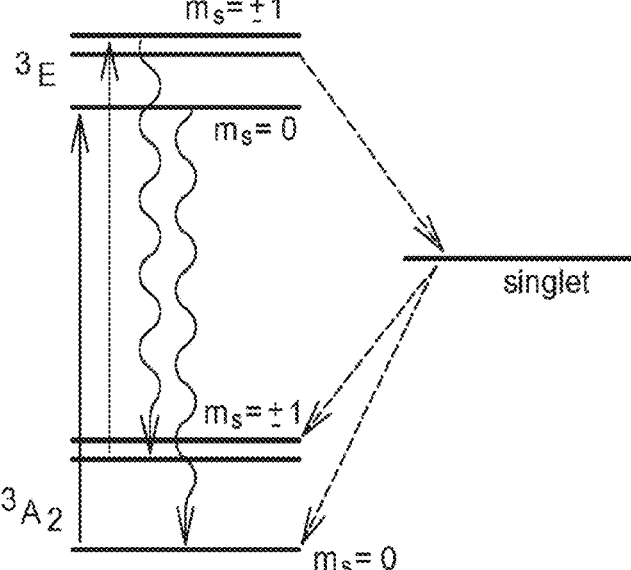
FIG. 2 is a schematic diagram of the energy levels of an NV center.

FIG. 2 is a schematic diagram of the energy levels of the NV center, and showing the ground state triplet state $^3A_2$, the excited triplet state $^3E$ and the singlet state. Owing to quantum mechanical selection rules, when the NV center is in the ms=0, respectively ms=±1 state, in the ground state, it tends to stay in the ms=0, respectively ms=±1, state when absorbing a green photon from the excitation light source, as shown by the two upward oriented straight arrows. Similar selection rules apply when the NV center is de-excited from the excited state to the ground state by the emission of a red fluorescence photon, as shown by the two downward oriented wobbly arrows. However, when the NV center lands in the ms=±1 levels in the excited state, it has a larger (about 7 times) probability to decay non radiatively in the singlet state than when in the ms=0 excited state. From the singlet state, the NV center returns preferentially (with twice larger probability) to the ms=0 ground state. As a result, the NV center can be optically polarized in the ms=0 ground state through the application of green excitation light. Red fluorescence is emitted owing to the radiative decay from the excited state to the ground state. This level of fluorescence varies depending on the initial spin level of the NV center in the ground state: more fluorescence is recorded when the NV center is initially in the ms=0 spin level than in the ms=±1 levels, owing to the non-radiative transitions through the singlet state in the second case.

A microwave field with a frequency around 2.87 GHz can be applied to change the spin state of the NV center in its ground state from ms=0 to ms=1 or ms=−1. When the frequency of the microwave field is resonant with the energy level difference, the spin state is changed and less red fluorescence is observed. This phenomenon is called Optically Detected Magnetic Resonance ('ODMR').

A magnetic field lifts the degeneracy between the ms=1 and ms=−1 levels. Therefore, when a magnetic field is applied to the NV center, two frequencies for which the fluorescence decreases can be observed. In a first approach, one can consider that the two frequencies are linearly related to the magnitude of the magnetic field:

$$f_{res} = 2.87\,\text{GHz} \pm \frac{\gamma}{2\pi} B \qquad \text{(Eq. 1)}$$

where B is the magnetic field aligned with the axis of the NV center (i.e. the axis defined by the alignment of the nitrogen atom and the gap) and γ is the gyromagnetic ratio of the NV center: γ/2π=28 GHz/T.

Figure 3:
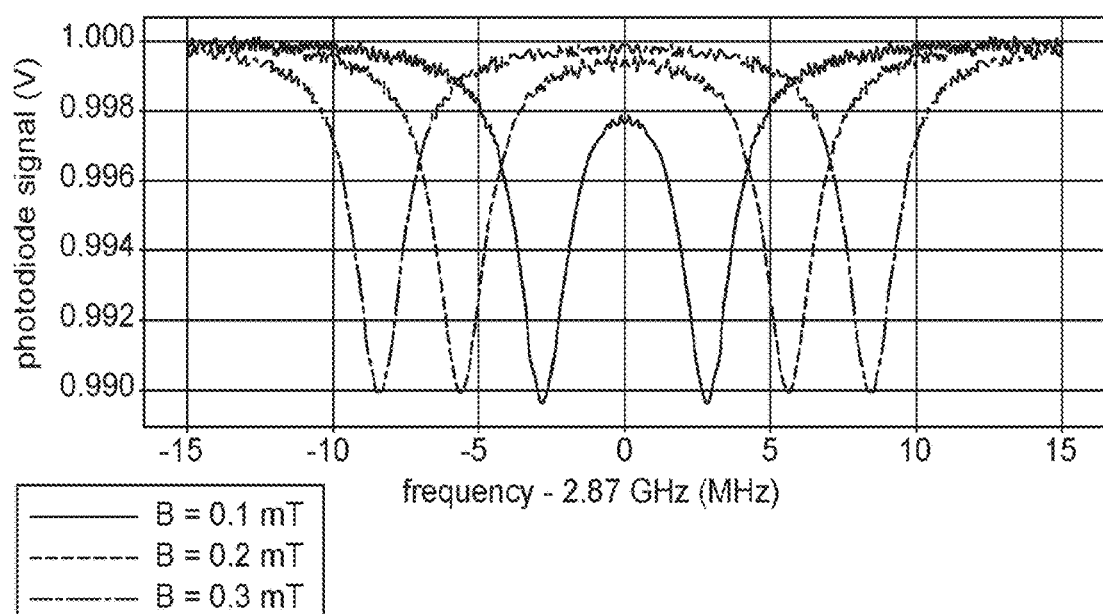
FIG. 3 is a graph of ODMR (Optically Detected Magnetic Resonance) data obtained by measuring the red fluorescence for different magnetic field values.

FIG. 3 is a graph of simulated ODMR data that can be obtained by measuring the red fluorescence for different magnetic field values. For each value of the magnetic field, the two resonance dips in the photodiode output signal and centered around the excitation frequency appear clearly. The spacing of the dips increases with the intensity of the magnetic field. Since the NV centers can exist in four different directions within the crystal, a total of four pairs of two resonances can actually be observed, each pair corresponding to a projection of the magnetic field vector onto a given direction of an NV axis. This allows to univocally identify the three spatial components of the magnetic field, and thus to obtain a vector measurement of the latter. The NV sensor allows an accurate vector measurement of a magnetic field, with a good sensitivity: the latter is often limited by the photon shot noise of the fluorescence light, reaching typical values ranging from pT/√Hz to nT/√Hz depending on the sensor design.

Figure 4:
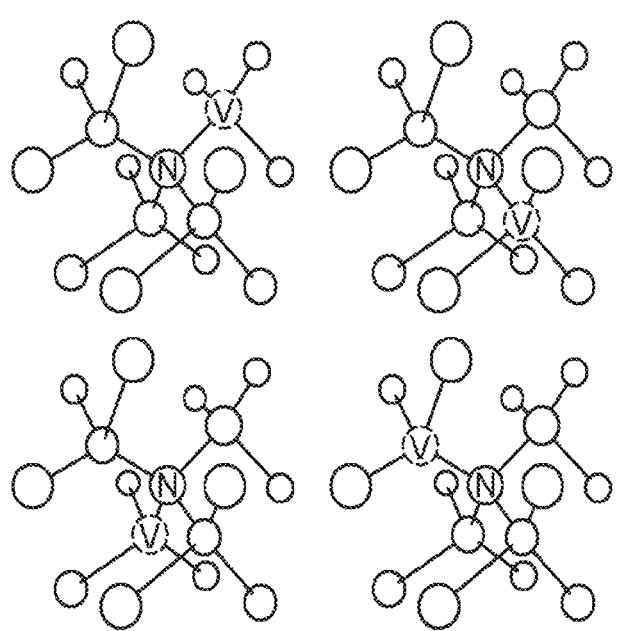
FIG. 4 is a schematic representation of a diamond crystal and its carbon atoms for all four orientations of the NV center.

The NV axis is defined by the direction which links the nitrogen atom to the vacancy. In a monocrystalline face-centered cubic diamond, the NV center exists in four possible orientations, which correspond to the four possible positions of the vacancy when the nitrogen atom is given, as shown on FIG. 4. These directions are actually defined by the ⟨111⟩ diagonals of the diamond cubic matrix. In most diamonds, the cut facets correspond to the {100} planes, which means that the NV axes are oriented away from the surfaces with angles θ=arctan(√2)≈54.7° while φ=45°, as shown on FIG. 5.

Figure 5:
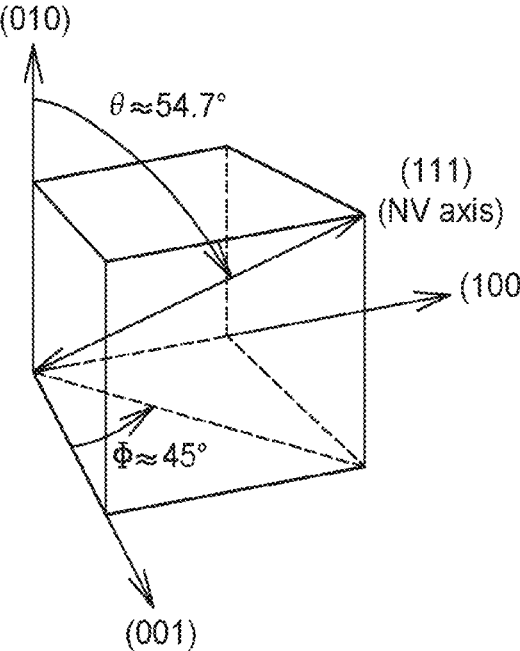
FIG. 5 is a schematic representation of a diamond crystal showing the angle of the NV axis with respect to the diamond axes.

Fabricating diamonds with different orientations, for example so that one facet is perpendicular with a ⟨111⟩ diagonal is possible but very difficult, and doping levels in NV centers are lower than for diamonds like described in FIG. 5.

By applying a microwave field to the NV center, while recording the red photoluminescence, it is possible to perform an optical detection of a magnetic resonance (ODMR). When the frequency of the microwave is scanned around 2.8 GHZ, reduction of photoluminescence is observed when the frequency matches the energy difference between the spin states with ms=0 and ms=±1. It is thus possible to measure the energy difference between the different spin states. In the presence of an external magnetic field, the energy of the ms=−1 and ms=+1 states changes due to the Zeeman effect. The NV center is therefore intrinsically an atomic-sized magnetometer. With diamonds highly doped in NV centers, one can improve the sensitivity and the resolution becomes limited by the size of the sensor. The diamond can then be attached to a fiber and a microwave cable to fabricate a fibered magnetometer, for example like in the work of Hatano et al. (Appl. Phys. Lett. 118, 034001 (2021)).

Figure 6:
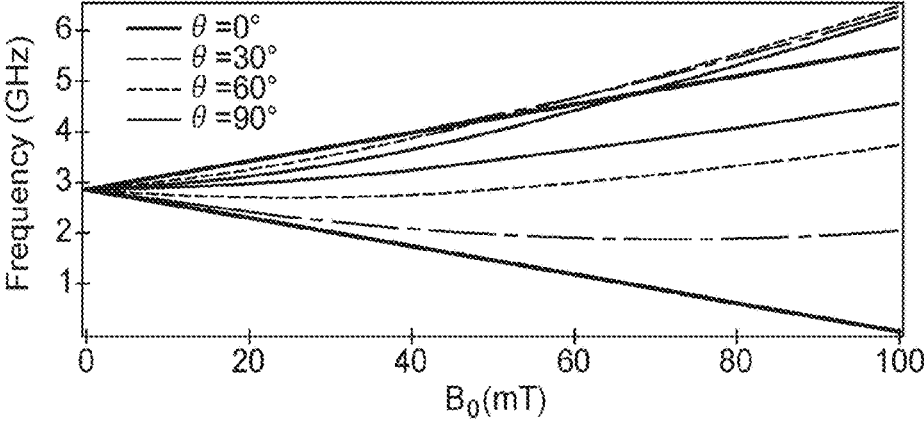
FIG. 6 is a graph showing evolution of the position of the ODMR lines with different magnetic field angles, the vertical axis showing the frequency and the horizontal axis showing the magnetic field.
Figure 7:
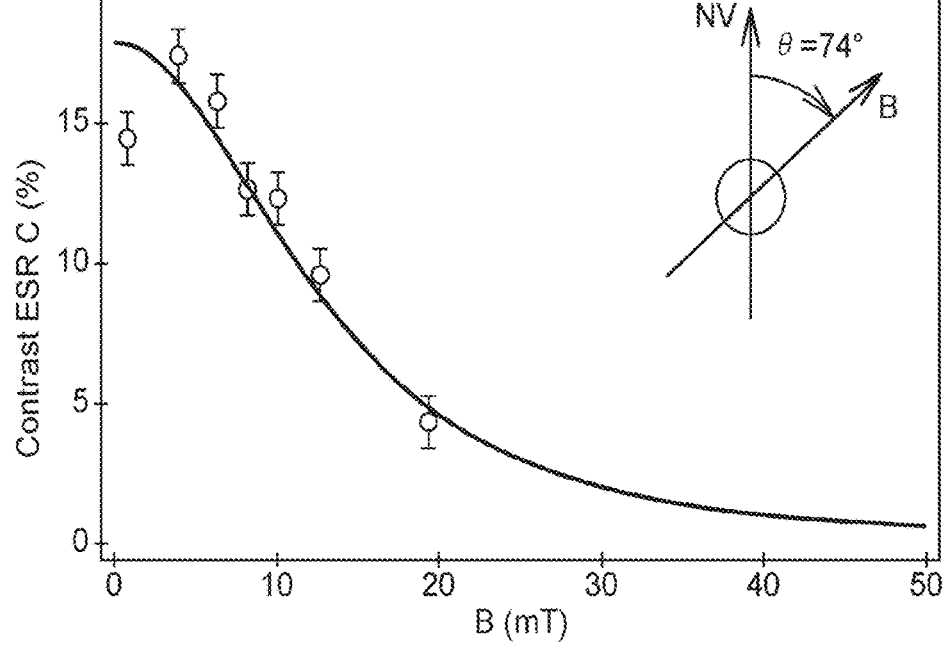
FIG. 7 is a chart plotting the evolution of the contrast of ODMR spectra with increasing the magnetic field with an angle of θ=74° with the NV axis.

FIG. 6 and FIG. 7 illustrate the influence of the angle between the magnetic field and the NV axis. These figures are extracted from the thesis report 'Réalisation d'un magnétomètre à centre coloré NV du diamant' Autre [cond-mat.other]. École normale supérieure de Cachan-ENS Cachan, 2012. Français. NNT: 2012DENS0065. tel-00824468. When the magnetic field to measure has a strong component orthogonal to the NV axis, the position of the lines evolves with the response is non-linear and can be mistaken for a temperature change. This non-linearity is described in FIG. 6 for different orientations θ of the magnetic field with respect to the NV axis.

Additionally, the contrast of the ODMR signal decreases when a strong off-axis magnetic field is applied, and the measurement is degraded. This is illustrated in FIG. 7 which display the evolution of the contrast of ODMR spectra with increasing the magnetic field with an angle of θ=74° with the NV axis. If the magnetic field is to be measured in a robust fashion, it is therefore desirable to align the NV axis with the measurement axis which is parallel to the direction of the magnetic field to be measured. In the notation above it means θ=0° or 180°.

Figure 8:
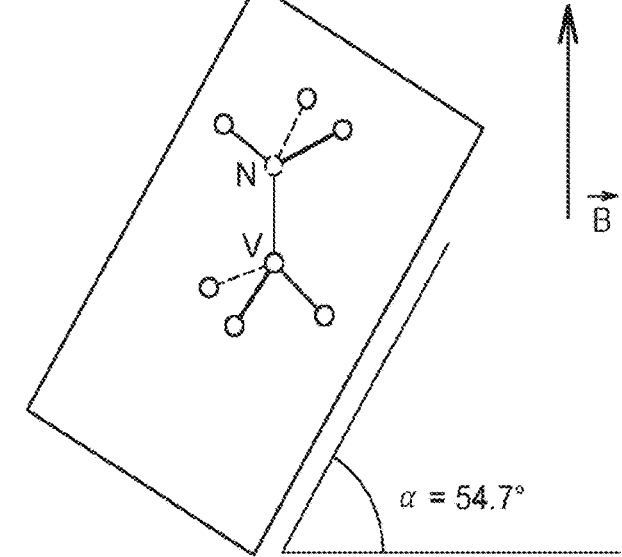
FIG. 8 is a schematic representation showing the alignment of the NV center of the NV diamond with the magnetic field to be measured.
Figure 13:
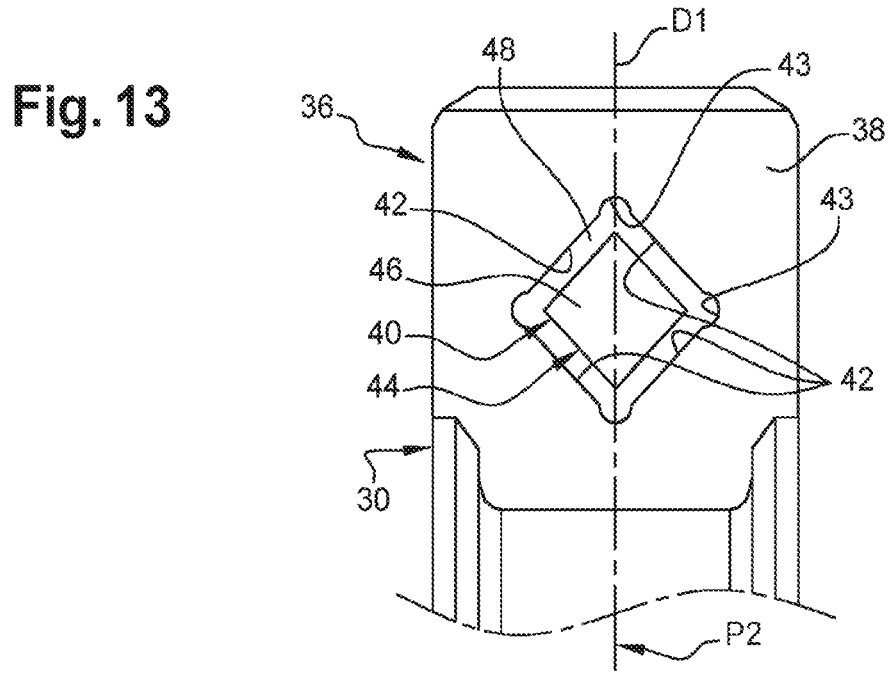
FIG. 13 is a rear view showing the socket before the NV diamond is mounted in a recess and illustrating the orientation of the recess.

On FIG. 8 is shown schematically the position required for the NV diamond with the NV axis parallel with the magnetic field B to be measured. It can be seen that the angle between a reference plane perpendicular to the magnetic field direction and a main surface of the NV diamond is equal to 54.7 degrees. A second rotation is performed around a normal to the main face of the NV diamond, and is such that the normal to a lateral face, or side facet, is oriented at 45° with respect to a normal to the plane containing the magnetic field axis B and a normal to the main face. This will become apparent on FIG. 13.

FIG. 9 to FIG. 13 show a sensor assembly 10 according to an embodiment of the invention allowing alignment of the NV axis with the measurement axis. The sensor assembly 10 comprises a NV diamond 12 of standard type which means a diamond where the cut facets correspond to the {100} planes.

Figure 9:
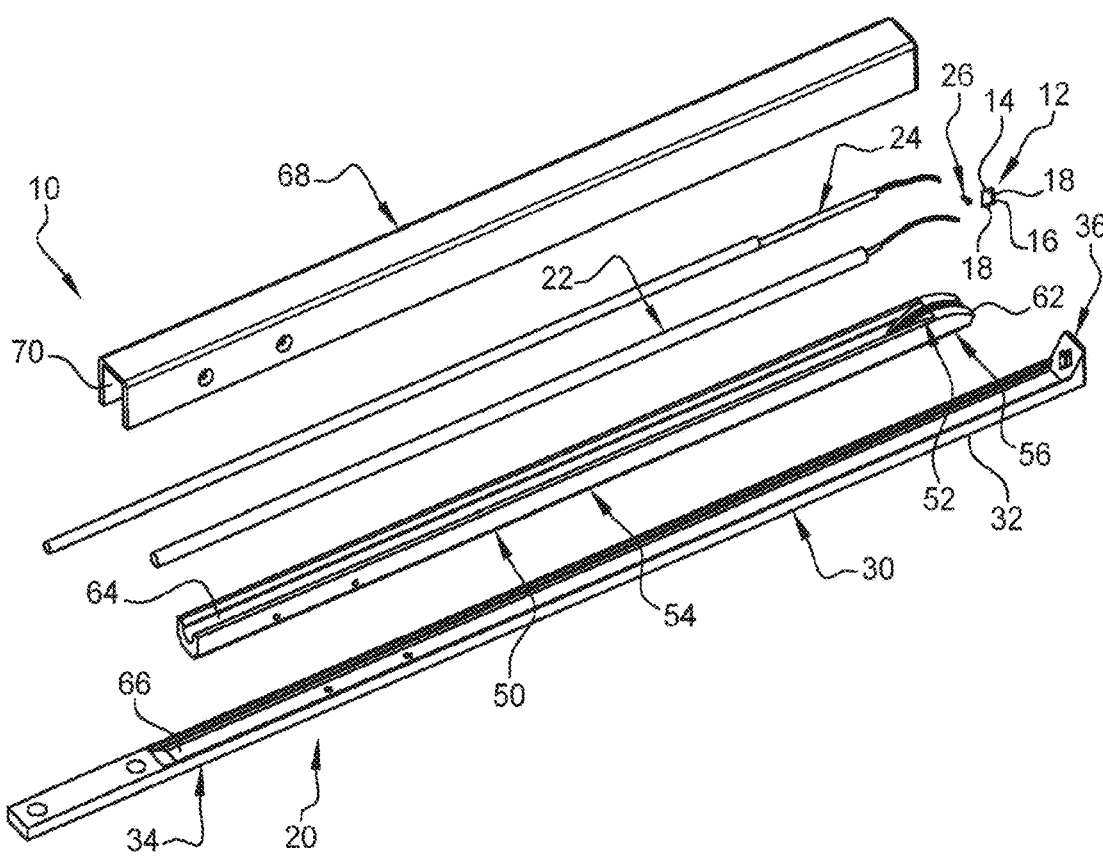
FIG. 9 is an exploded perspective view showing a sensor assembly according to a non-limiting exemplary embodiment comprising a socket for a NV diamond.
Figure 11:
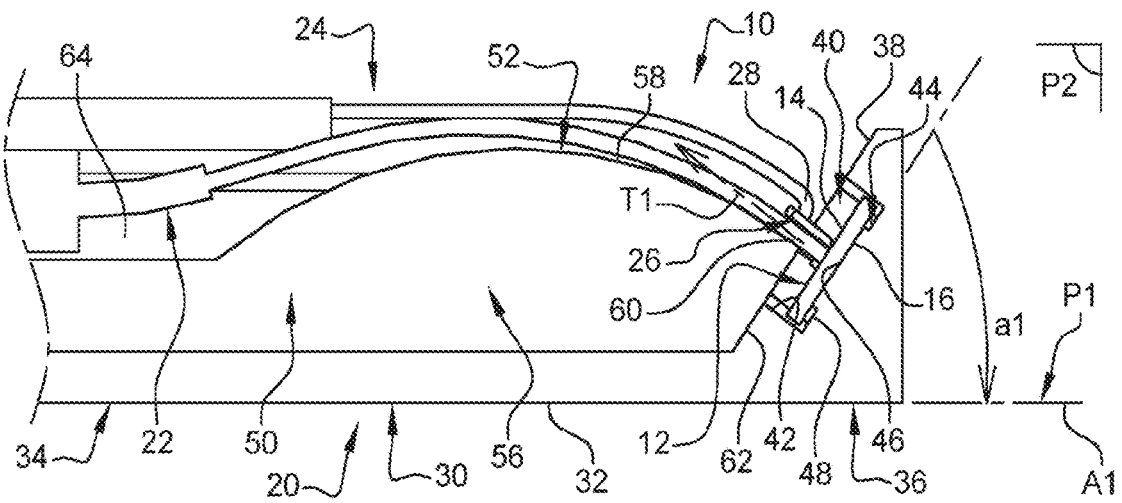
FIG. 11 is a cross-section view according to section plane XI-XI of FIG. 10 showing the sensor assembly of FIG. 9.

As can be seen on FIG. 9 and FIG. 11, the NV diamond 12 has a general parallelepipedic shape comprising a top main surface 14, a bottom main surface 16, and four side facets 18. The top and bottom main surfaces 14, 16 are square surfaces.

The sensor assembly 10 comprises a mounting support 20 which is designed to receive the NV diamond 12 with at least one optical fiber 22 and two microwave cables 24. The optical fiber 22 has its free end connected to the NV diamond 12, for example by gluing to the top main surface 14.

According to the embodiment shown, the microwave cables 24 are constituted of two coaxial cables which bring the micro-wave excitation to the extremity of the sensor assembly 10. There are several possibilities to generate the microwave magnetic field that excites the NVs. The simplest way is to connect a shorted wire between the core and the sheath of the coaxial cables. The wire can be coiled to increase the field strength.

In the present embodiment, two wires 28 are connected to the sheath and core of each coaxial cable, and soldered at their other end to a mounting bracket 26. The mounting bracket 26 is made of a small bent copper antenna that encircles the optical fiber 22 and that serves as a short circuit. The mounting bracket 26 can be glued to the top main surface 14 of the NV diamond 12.

In an alternative embodiment (not shown), a coaxial connector could be used and soldered directly to a copper patch used to make the short circuit. The coaxial cable is connected to the short circuit via the connector. Another option is to use a microwave resonator (cavity, resonator circuit, etc.), which is only connected to the core of the coaxial cable. In this case there is no short circuit.

The mounting support 20 comprises a support element 30 having a bottom surface 32 defining a reference plane P1. Said support element 30 is formed of an elongated plate member 34 extending along a longitudinal axis A1 and having, at a front end, a socket 36 designed to receive the NV diamond 12 in a predetermined angular position a1 different from zero or 90 degrees, preferably of 54.7 degrees, allowing predetermined alignment of the NV axis with regards to the reference plane P1.

In the following description, an orientation along the longitudinal axis A1 will be used without any limitation purpose, for the sake of better understanding. Said longitudinal axis A1 is orientated from front to rear which corresponds to an orientation from right to left when considering FIG. 10 or FIG. 11.

The socket 36 comprises a rear facing sloped surface 38 which is inclined preferably at the same angle a1 as the NV diamond 12 of 54.7 degrees with regards to the reference plane P1, as can be seen on FIG. 11. A recess 40 for the NV diamond 12 is formed in the sloped surface 38, preferably by machining. The recess 40 comprises peripheral retaining surfaces 42 for the NV diamond 12 which form predetermined angles such that, when the NV diamond 12 is received in the recess 40, a diagonal D1 extending from a diamond top corner to a diamond bottom corner is within a longitudinal plane P2 perpendicular to the reference plane P1. With regards to the sloped surface 38 and its top and bottom edges, the recess 40 and its side edges are shifted from 45 degrees as illustrated on FIG. 13. Preferably, each corner of the recess 40 comprises a semi-cylindrical surface 43 allowing for easier insertion of the NV diamond 12 in the recess 40 while still ensuring precise positioning of the NV diamond 12 while cooperating with the retaining surfaces 42.

The NV diamond 12 should be positioned as close as possible to the angle a1 of 54.7 degrees and the rear facing sloped surface 38 should define an angle a1 as close as possible to the angle of 54.7 degrees, preferably equal to 54.7 degrees. Alternatively, a slight angle deviation could work as well, for example +/−5 degrees. The higher the magnetic field to be measured would be, the more accurate the angle a1 should be. Regarding the 45 degrees shift, the same would apply. It is important to be as close as possible to 45 degrees, preferably equal to 45 degrees, but a slight deviation would not prevent the sensor assembly to work as well. What is important is that the deviation should not deteriorate the measurement to a non-acceptable level.

Advantageously, the recess 40 comprises an extruded platform 44 which forms a bearing surface 46 for the bottom main surface 16 of the NV diamond 12. Said extruded platform 44 is elevated compared to a recess bottom portion 48 which ensure accurate positioning of the NV diamond 12 within the recess 40. The bearing surface 46 is tilted, with regards to the reference plane P1, of the same angle a1 of 54.7 degrees as for the sloped surface 38. The NV diamond 12 has a square surface, its bottom main surface 16, facing the extruded platform 44, so that the diagonal D1 represents 45 degrees.

Preferably, the support element 30 is made of one piece by machining, including the socket 36. In an alternative embodiment, the elongated support element 30 could be manufactured differently, for example by molding or additive manufacturing.

The mounting support 20 also comprises a holder element 50 which is mounted on the support element 30, and which comprises a guiding surface 52 to guide and bend the optical fiber 22 from the NV diamond 12 to a rear portion 54 of the holder element 50. The guiding surface 52 is arranged on a front portion 56 of the holder element 50, close to the socket 36. Said guiding surface 52 comprises a groove 58 having an arc shaped profile within the longitudinal plane P2. The groove 58 is designed such that a tangent Tl to the arc shaped profile at a groove front end 60 is perpendicular to the diamond top main surface 14.

According to an alternative embodiment (not shown), the holder element 50 could be made of one piece with the support element 30.

Advantageously the holder element front portion 56 comprises a holder element sloped surface 62 which is complementary to the socket sloped surface 38 and which comes in abutment against the socket sloped surface 38 when the NV diamond 12 is received inside the recess 40.

The holder element rear portion 54 comprises a channel part 64 which extends from the holder element front portion 56 to a rear end of the holder element 50, and which is designed to hold a section of the optical fiber 22 and a section of the microwave cables 24. The channel part 64 is made as an elongated portion of the holder element 50 with a U-shaped cross section.

Figure 10:
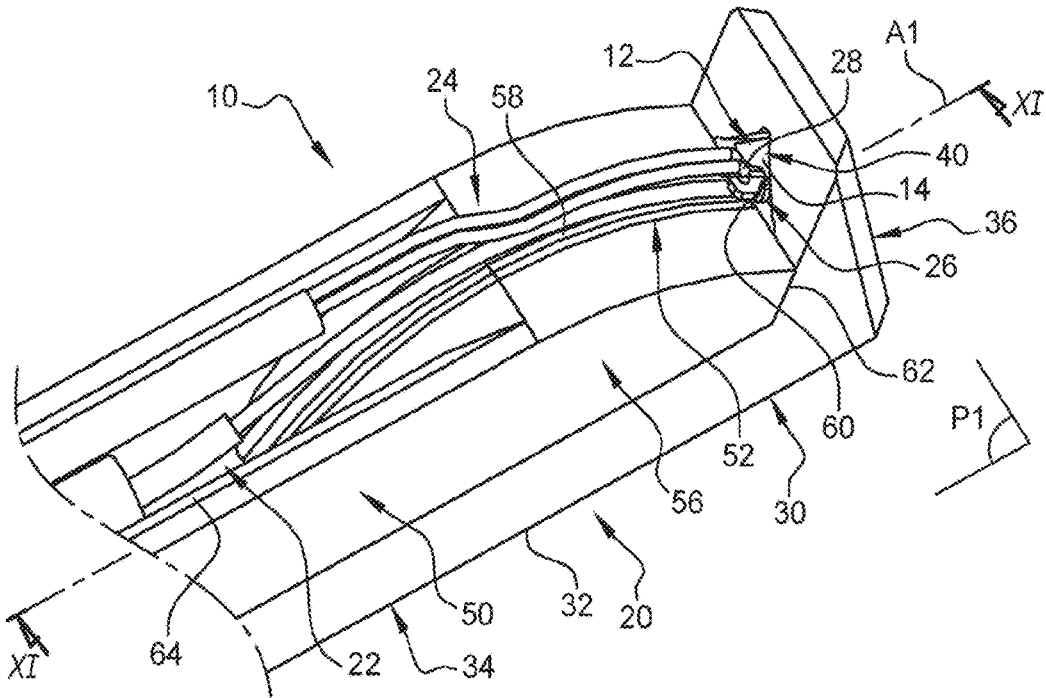
FIG. 10 is a perspective view of a front portion of the sensor assembly of FIG. 9 with a top cover removed and a holder element in a front position in abutment against the socket.
Figure 12:
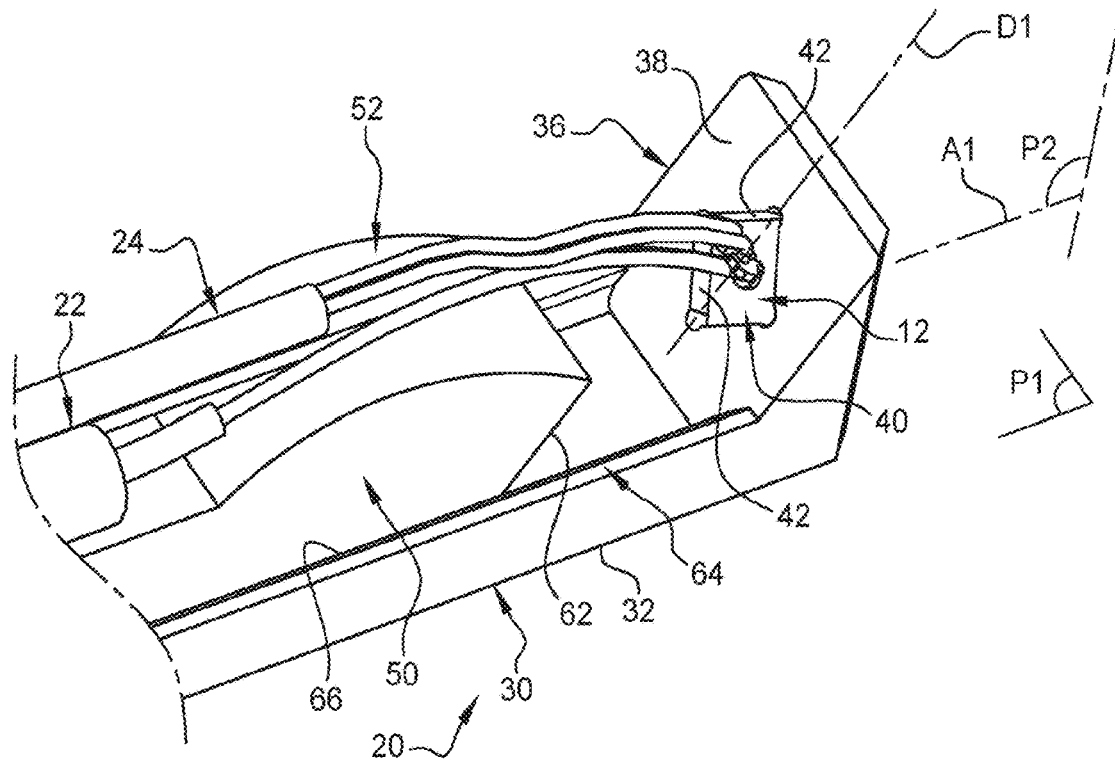
FIG. 12 is a perspective view of the front portion of the sensor assembly as in FIG. 10 with the holder element in a rear position.

Advantageously the elongated plate member 34 includes a guiding portion forming a guiding rail 66 for the holder element 50 to allow the holder element 50 to slide along the guiding rail 66 from a rear position away from the socket 36, which is shown on FIG. 12, to a front position in abutment against the socket 36, as shown on FIG. 10 and FIG. 11. The guiding rail 66 has a cross-section at least partly complementary to the cross-section of the holder element 50 in order to allow the holder element 50 to slide in the guiding rail 66.

Advantageously, the mounting support 20 also comprises a top cover 68 which is mounted on the support element 30 above the holder element 50 and above the socket 36 to enclose the NV diamond 12, the optical fiber 22, and the microwave cables 24.

An assembly method will now be described. The optical fiber 22 and the microwave cables 24 are attached to the NV diamond top main surface 14 with the mounting bracket 26 by gluing or any other suitable means. Then the NV diamond 12 is inserted into the recess 40 until its bottom main surface 16 bears against the bearing surface 46. The NV diamond 12 is maintained in its predetermined position thanks to the retaining surfaces 42 and the bearing surface 46. Glue is also injected into the recess 40 on top of the NV diamond 12 to entirely seal it and secure its position together with the optical fiber 22 and microwave cables 24 free ends.

Then the holder element 50 is slid from its rear position, shown on FIG. 12, to its front position, shown on FIG. 10 and FIG. 11, along the guiding rail 66. The top cover 68 is then assembled to the support element 30, for example with screw mount. The mounting support 20 still has a rear opening 70 through which the optical fiber 20 and the microwave cables 24 extends to be connected to a control unit 72 forming part of a magnetometer 74 shown on FIG. 14.

Figure 14:
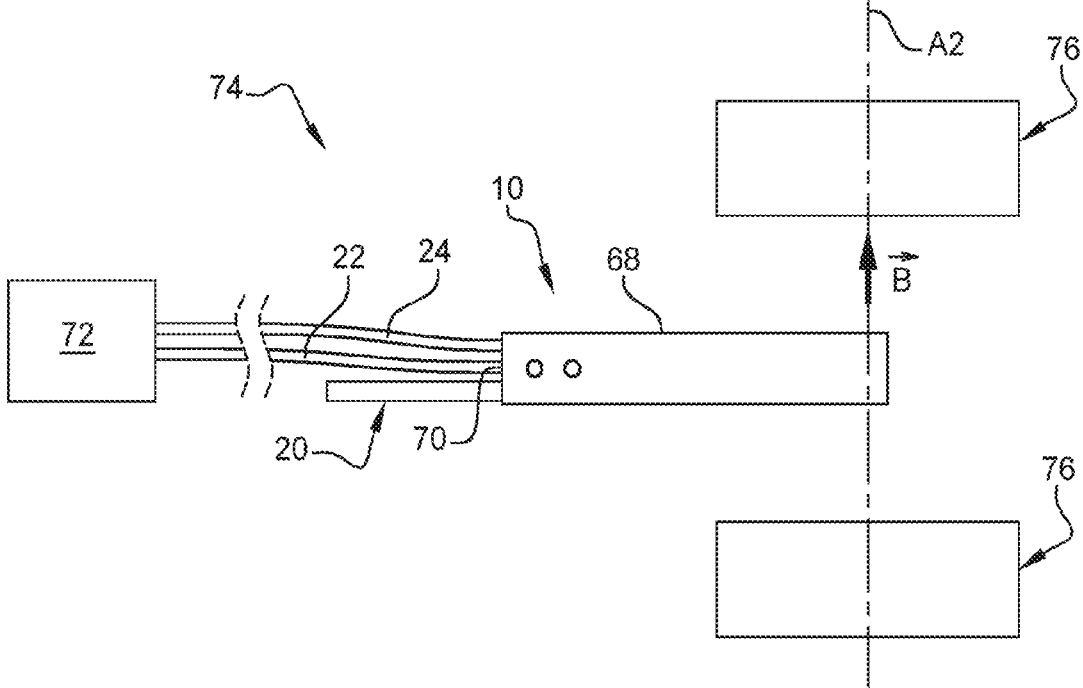
FIG. 14 is a schematic representation showing a magnetometer equipped with the sensor assembly of FIG. 9.

As an exemplary embodiment shown on FIG. 14, the magnetometer 74 implements the sensor assembly 10 according to the invention to measure the magnetic field B generated between two coils 76 along a vertical axis A2 corresponding to the NV axis of the NV diamond 12 forming part of the sensor assembly 10.

Advantageously, the mounting support 20 is designed to be rather long in comparison with the size of the NV diamond 12 because this kind of sensor is usually used in places difficult to reach with a classic setup. It is why the sensor assembly 10 has a long length but small width and height. It is therefore important to have a long and narrow mounting support 20 that can be easily manipulated.

The sensor assembly 10 is particularly useful when implemented in a high field stabilization scheme but it can be derived to any usage of a NV magnetometer 74 with bulk diamonds.

Although the embodiment described in connection with the figures relates to an NV diamond 12 in a predetermined angular position having an angle a1 of 54.7 degrees allowing alignment of the NV axis with regards to the reference plane P1 along a perpendicular direction to the reference plane P1, i.e. parallel to the magnetic field axis B, other embodiments would work as well with for example an angle a1 of 125.3 degrees.

Alternatively, the angular position of the NV diamond 12 in the mounting support 20 could be equal to respectively 135 degrees, 225 degrees, or 315 degrees while still allowing proper measurement along an axis perpendicular to the reference plane P1, whether the angle a1 is of 54.7 degrees or 125.3 degrees.

| References to the Drawings | |
| --- | --- |
| 10 | Sensor assembly |
| 12 | NV diamond |
| 14 | diamond top main surface |
| 16 | diamond bottom main surface |
| 18 | side facets |
| 20 | mounting support |
| 22 | optical fiber |
| 24 | microwave cables |
| 26 | mounting bracket |
| 28 | wires |
| 30 | support element |
| 32 | bottom surface |
| 34 | elongated plate member |
| 36 | socket |
| 38 | socket sloped surface |
| 40 | recess |
| 42 | retaining surfaces |
| 43 | semi-cylindrical surface |
| 44 | extruded platform |
| 46 | bearing surface |
| 48 | recess bottom portion |
| 50 | holder element |
| 52 | guiding surface |
| 54 | holder element rear portion |
| 56 | holder element front portion |
| 58 | groove |
| 60 | groove front end |
| 62 | holder element sloped surface |
| 64 | channel part |
| 66 | guiding rail |
| 68 | top cover |
| 70 | rear opening |
| 72 | control unit |
| 74 | magnetometer |
| 76 | coils |
| a1 | angle between NV diamond and reference plane |
| A1 | longitudinal axis |
| A2 | NV axis |
| P1 | reference plane |
| P2 | longitudinal plane |
| T1 | tangent |

The invention claimed is:

1. A sensor assembly comprising:
a nitrogen-vacancy diamond,
an optical fiber which front end is connected to a top main surface of the nitrogen-vacancy diamond,
a micro-wave cable which front end is connected to the nitrogen-vacancy diamond,
a mounting support,
characterized in that the mounting support comprises a support element having a bottom surface defining a reference plane, and having, at a front end, a socket designed to receive the nitrogen-vacancy diamond in a predetermined angular position other than zero and 90 degrees allowing predetermined alignment of its nitrogen-vacancy axis with regards to the reference plane, said socket comprising a recess for housing said nitrogen-vacancy diamond in the predetermined angular position.

2. The sensor assembly according to claim 1, wherein the recess comprises peripheral retaining surfaces for the diamond which form predetermined angles such that, when the nitrogen-vacancy nitrogen-vacancy diamond is received in the recess, a diagonal extending from a nitrogen-vacancy diamond top corner to a nitrogen-vacancy diamond bottom corner is within a longitudinal plane perpendicular to the reference plane.

3. The sensor assembly according to claim 1, wherein the recess comprises an extruded platform which forms a bearing surface for a main surface of the nitrogen-vacancy diamond, said platform being elevated compared to a recess bottom portion.

4. The sensor assembly according to claim 3, wherein the bearing surface is tilted, with regards to the reference plane, of an angle around 54.7 or 125.3 degrees+/−5 degrees.

5. The sensor assembly according to claim 1, wherein the mounting support comprises a holder element on the support element, and which comprises a guiding surface to guide and bend the optical fiber from the nitrogen-vacancy diamond to a rear portion of the holder element, said optical fiber having a front section received in the holder element.

6. The sensor assembly according to claim 5, wherein the guiding surface is arranged on a front portion of the holder element, close to the socket, said guiding surface comprising a groove having an arc shaped profile within a longitudinal plane perpendicular to the reference plane.

7. The sensor assembly according to claim 6, wherein the groove is designed such that a tangent to the arc shaped profile at a groove front end is perpendicular to a diamond main surface which receives a front end of the optical fiber.

8. The sensor assembly according to claim 5, wherein the rear portion of the holder element comprises a channel part which extends from the front portion to a rear end of the holder element, and which is designed to hold at least a section of the optical fiber.

9. The sensor assembly according to claim 1, wherein the recess is arranged in a socket sloped surface defining a slope angle corresponding to the predetermined angular position.

10. The sensor assembly according to claim 9, wherein the mounting support comprises a holder element on the support element, and which comprises a guiding surface to guide and bend the optical fiber from the nitrogen-vacancy diamond to a rear portion of the holder element, said optical fiber having a front section received in the holder element, and wherein the holder element front portion comprises a holder element sloped surface which is complementary to the socket sloped surface and which comes in abutment against the socket sloped surface when the nitrogen-vacancy diamond is in position inside the recess.

11. The sensor assembly according to claim 1, wherein the mounting support comprises a holder element on the support element, and which comprises a guiding surface to guide and bend the optical fiber from the nitrogen-vacancy diamond to a rear portion of the holder element, said optical fiber having a front section received in the holder element, and wherein the support element comprises an elongated portion forming a guiding rail for the holder element to allow the holder element to slide from a rear position away from the socket to a front position in abutment against the socket.

12. The sensor assembly according to claim 1, comprising a top cover which is arranged above the socket to enclose the nitrogen-vacancy diamond and the optical fiber.

13. The sensor assembly according to claim 1, wherein the socket is made of one piece with the support element.

14. The sensor assembly according to claim 1, wherein the nitrogen-vacancy diamond is a monocrystalline face-centered cubic diamond, the cut facets of the nitrogen-vacancy diamond corresponding to the planes such that a nitrogen-vacancy axis within the nitrogen-vacancy diamond is perpendicular to the reference plane when it is mounted in the socket.

15. A magnetometer comprising a sensor assembly according to claim 1.

* * * * *